US008483327B2

(12) United States Patent
Schmidl et al.

(10) Patent No.: US 8,483,327 B2
(45) Date of Patent: Jul. 9, 2013

(54) REVERSE VITERBI AND FORWARD SERIAL LIST VITERBI DECODING FOR FER

(75) Inventors: Timothy M. Schmidl, Dallas, TX (US); Ariel Zaltsman, Raanana (IL); Anand G. Dabak, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 12/383,154

(22) Filed: Mar. 20, 2009

(65) Prior Publication Data

US 2009/0238311 A1    Sep. 24, 2009

Related U.S. Application Data

(60) Provisional application No. 61/038,836, filed on Mar. 24, 2008.

(51) Int. Cl.
*H04L 27/06* (2006.01)

(52) U.S. Cl.
USPC .......................................... 375/341; 714/755

(58) Field of Classification Search
USPC ................. 375/265, 341; 714/755, 781, 786, 714/795
See application file for complete search history.

(56) References Cited

U.S. PATENT DOCUMENTS

| 7,032,161 B2* | 4/2006 | Kanasugi et al. ............. 714/781 |
| 7,555,070 B1* | 6/2009 | Ulriksson et al. ............. 375/341 |
| 2002/0166092 A1* | 11/2002 | Kyosti et al. ................. 714/752 |
| 2003/0235240 A1* | 12/2003 | Kawamoto et al. ........... 375/148 |
| 2008/0317112 A1* | 12/2008 | Oh et al. ....................... 375/232 |

OTHER PUBLICATIONS

Nill et al ("List and soft symbol output Viterbi algorithms: extensions and comparisons", IEEE Transactions on Communications Feb./Mar./Apr. 1995 vol. 43 Issue 234, pp. 277-287).*

Seshradi et al., "List Viterbi Decoding Algorithms with Applications," IEEE Trans. on Communications, vol. 42, No. 2/3/4, pp. 313-323 (Feb./Mar./Apr. 1994).

Seshradi et al. "Generalized Viterbi Algorithms for Error Detection with Convolutional Codes," GLOBECOM, vol. 3, pp. 1534-1538 (1989).

Kuhn "Applying List Output Viterbi Algorithms to a GSM-based Mobile Cellular Radio System," IEEE International Conf. on Universal Personal Communications (ICUPC), vol. 2, pp. 878-882 (Oct. 12-16, 1997).

Chugg et al. "Iterative Detection: Adaptivity, Complexity Reduction, and Applications," Springer, p. 36 (2001).

* cited by examiner

*Primary Examiner* — Leon-Viet Nguyen
(74) *Attorney, Agent, or Firm* — Ronald O. Neerings; Wade James Brady, III; Frederick J. Telecky, Jr.

(57) ABSTRACT

A convolutionally encoded frame to be decoded includes a first portion of bits having additional error protection and another portion without additional error protection. The decoding of the frame involves reverse Viterbi decoding or Viterbi decoding on a reversed bit sequence followed by applying a serial list Viterbi algorithm to the first portion. The result is that the list of probable sequences have unique sets of bits in the first portion.

6 Claims, 3 Drawing Sheets

REVERSE VITERBI AND FORWARD SERIAL LIST VITERBI DECODING FOR FER

RELATED APPLICATIONS

The present application claims priority to provisional Patent Application Ser. No. 61/038,836 filed Mar. 24, 2008, the disclosure of which is incorporated by reference herein, in its entirety.

BACKGROUND

The present invention relates generally to signal processing and, more particularly, to Viterbi decoding.

DESCRIPTION OF RELATED ART

In communication systems, voice or data frames may be affected by noise and interference which can result in frame error and other types of degradation in performance. One approach to protecting against bit errors is to use convolutional coding techniques that can correct some bit errors. In addition, a cyclic redundancy check (CRC) may also be used to help with the detection of frame errors. In communication systems, such as cellular telephone for example, when a frame error is detected in a voice transmission then error concealment can be used or if in a data transmission, then retransmission can be performed.

Viterbi decoding is a method that finds the maximum likelihood sequence from the received data. A refinement of this decoding algorithm is known as list Viterbi decoding (LSV) and involves finding a set of the most probable sequences. Although there have been different approaches to producing such a list of probable sequences, one popular approach is known as the serial list Viterbi algorithm (SLVA) which produces one probable sequence at a time. For example, the maximum likelihood sequence is produced, then the second most probable sequence and the third, etc.

The trellis diagram 100 of FIG. 1 helps illustrate list Viterbi decoding. In the diagram, their there is a node for each state (00, 01, 10, 11) at each time, or bit position, (i=1-i=10). The maximum likelihood sequence can be represented as the best path through the trellis and any subsequent sequence may also be represented by a path through the trellis. Thus, the best path 102 is found using the Viterbi decoding algorithm which, for purposes of example, is the straight path having state "00" at each time interval. For each node, a difference in delta path metrics ($\Delta(s_i)$) is calculated between the merging paths. The second best path 104 is found by finding the minimum of these delta path metrics to find where the second best path will diverge from the best path. Continuing traceback from this diverging point to where re-merging occurs with the best path gives the second best path. To find the third best path, the next minimum delta metrics is found (which can be from either the second best path or the first best path). The metrics of FIG. 1 are arbitrary for purposes of making an example.

Serial list Viterbi algorithms (SLVAs) as described above have been applied to many communication systems including speech communication systems. One such speech system is GSM speech which classifies some bits in each frame as more important bits for reconstructing the frame and other bits in the frame as less important bits. The loss of the more important bits can noticeably degrade voice quality while the loss of the less important bits are less noticeable. In GSM speech, the frame is constructed using a convolutional encoder which receives signal bits and encodes the bits to form the frame and the more important bits are also protected by a CRC, thus the more important bits are protected by the CRC and the convolutional code and the less important bits are protected by the convolutional code. The application of previous SLVAs to such types of frames is less than optimal and, thus, there remains a need to improve and optimize the application of SLVAs to reconstructing frames that have groups of bits having different levels of protection from error.

BRIEF SUMMARY

Embodiments of the present invention relate to a convolutionally encoded frame to be decoded that includes a first portion of bits having additional error protection and another portion without additional error protection. The decoding of the frame involves reverse Viterbi decoding or Viterbi decoding on a reversed bit sequence followed by applying a serial list Viterbi algorithm to the first portion. The result is that the list of probable sequences have unique sets of bits in the first portion.

It is understood that other embodiments of the present invention will become readily apparent to those skilled in the art from the following detailed description, wherein it is shown and described only various embodiments of the invention by way of illustration. As will be realized, the invention is capable of other and different embodiments and its several details are capable of modification in various other respects, all without departing from the spirit and scope of the present invention. Accordingly, the drawings and detailed description are to be regarded as illustrative in nature and not as restrictive.

BRIEF DESCRIPTION OF DRAWINGS

Various aspects of embodiments of the invention are illustrated by way of example, and not by way of limitation, in the accompanying drawings, wherein.

DETAILED DESCRIPTION

The detailed description set forth below in connection with the appended drawings is intended as a description of various embodiments of the invention and is not intended to represent the only embodiments in which the invention may be practiced. The detailed description includes specific details for the purpose of providing a thorough understanding of the invention. However, it will be apparent to those skilled in the art that the invention may be practiced without these specific details. In some instances, well known structures and components are shown in block diagram form in order to avoid obscuring the concepts of the invention.

Figure 1:
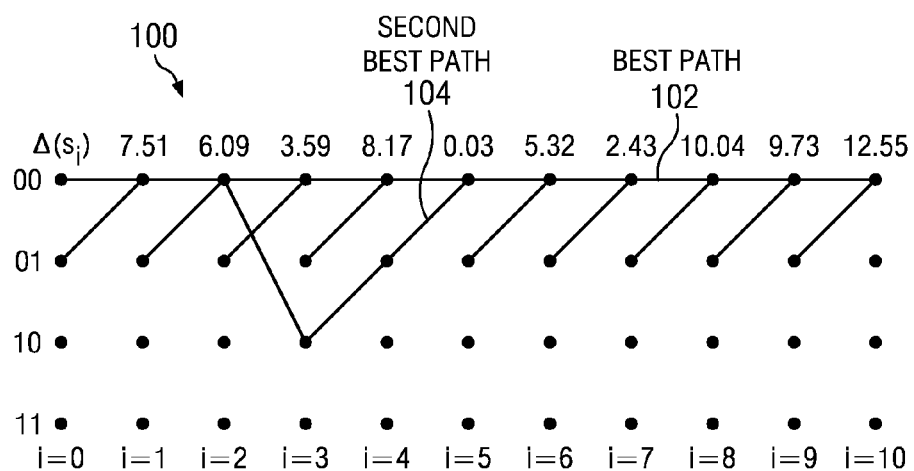
FIG. 1 depicts a trellis diagram for a Viterbi decoder.
Figure 2:
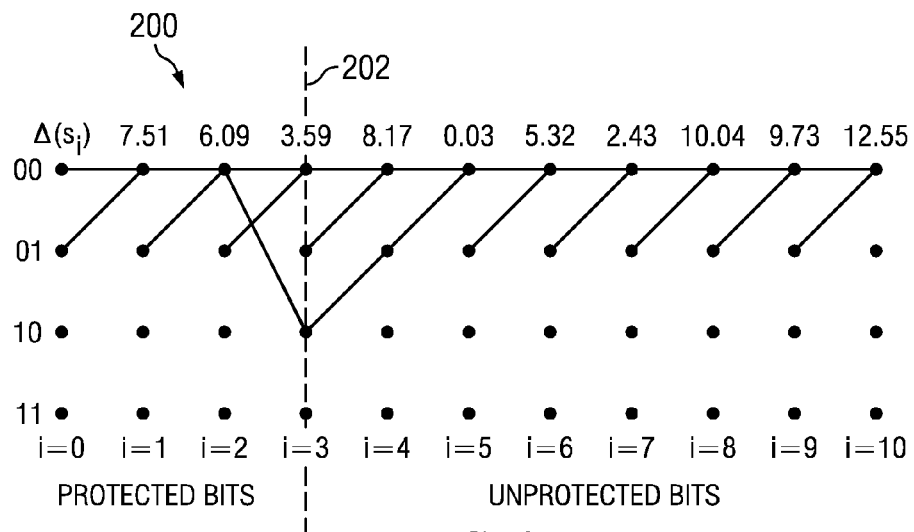
FIG. 2 depicts a trellis diagram of a Viterbi decoder with a serial list Viterbi algorithm (SLVA) boundary.

In practice, an SLVA for reconstructing a frame may not be applied to the entire frame but may have an arbitrary boundary such that sequences having a length of x bits are used for determining the best path and any of the subsequent most probable paths in the list. FIG. 2 illustrates this principle with a trellis diagram 200 having a boundary 202 at bit i=3. Thus, only sequences for bits i=0 through i=3 are used when evaluating path likelihood or path metrics. The boundary 202 may for example be located so as to separate more important bits from less important bit where the more important bits have some type of additional error protection. The additional protection may include for example, an additional CRC or being encoded at a higher rate than the less important bits.

To provide a concrete example of such a system consider AFS12.2, a full-rate 12.2 kbps adaptive multirate codec that separates the bits into 81 class 1a bits, 6 CRC bits, and 163 class 1b bits. The class 1a bits are considered more important bits for frame reconstruction as compared to the class 1b bits. Thus, the class 1a bits are protected with a CRC of 6 bits. There may also be tail bits that can be used to ensure the frame ends in a desired state. The trellis diagram 300 of FIG. 3 depicts this type of system with the boundary 302 for the SLVA search being located at the bit position between the 87 class 1a and CRC bits and the remaining 163 class 1b bits.

If the SLVA is set to find sequences only over the first 87 bits (class1a+CRC), then there will be paths missed by the SLVA where the alternative bit sequences have bit differences for both class 1a and class 1b bits. For example in FIG. 3, the second best path 304 is missed during traceback because it diverges from the best path before the boundary 302. In other words, in FIG. 3, the SLVA search is conducted to the left of the boundary 302 and because it does not extend to the right of the boundary 302, the second best path 304 is not identified as one of the most probable paths.

Figure 3:
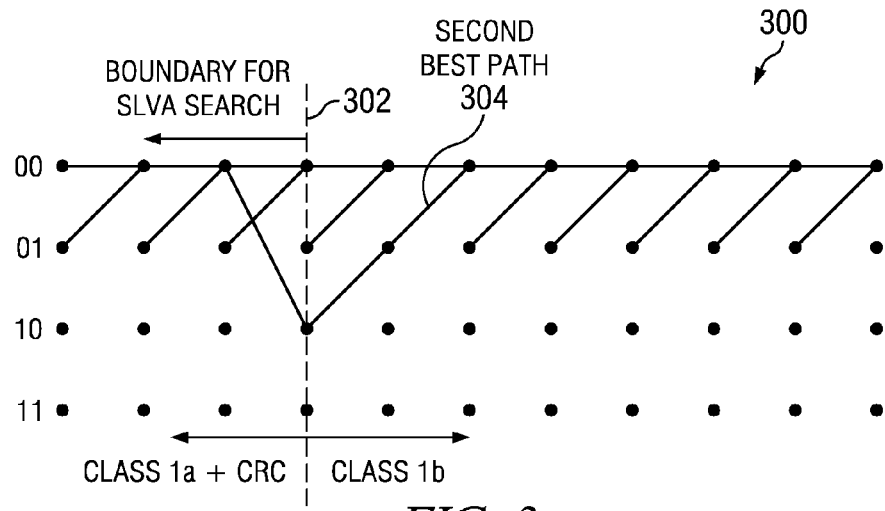
FIG. 3 depicts a trellis diagram for Viterbi decoder with an SLVA boundary between different bit classes.
Figure 4:
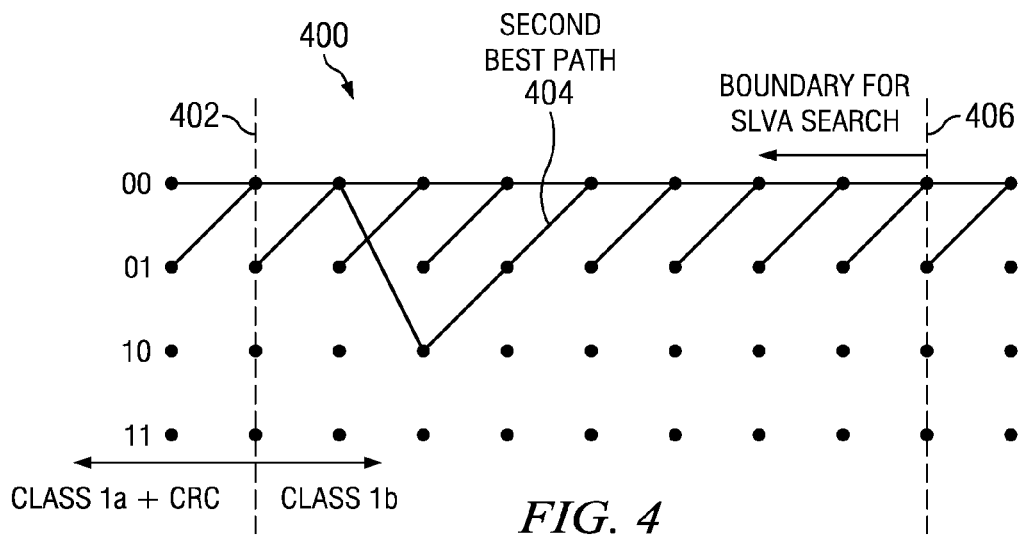
FIG. 4 depicts a trellis diagram for Viterbi decoder with an SLVA boundary positioned differently than in FIG. 3.

Extending the search window for the SLVA so that it covers at least some of the class 1b bits may correct for sequences such as that of FIG. 3. FIG. 4 shows an exemplary diagram of such an approach. There remains a bit position boundary 402 between the class 1a and CRC bits and the class 1b bits. However, the SLVA search boundary 406 has been moved to include at least some of the class 1b bits. In this instance, the second best path 404 is identified. However, the second best path 404 may differ from other probable sequences only within the class 1b bits. Identification of these types of alternative sequences, though, does not improve the frame error rate because none of the CRC protected bits are changed in the alternative sequences identified during the SLVA search. Because the SLVA may be limited to finding the most probable 20 sequences (or some other number), it is not beneficial to spend computational resources to find alternative paths that differ only in the class 1b bits because doing so does not reduce the frame error rate.

Figure 5:
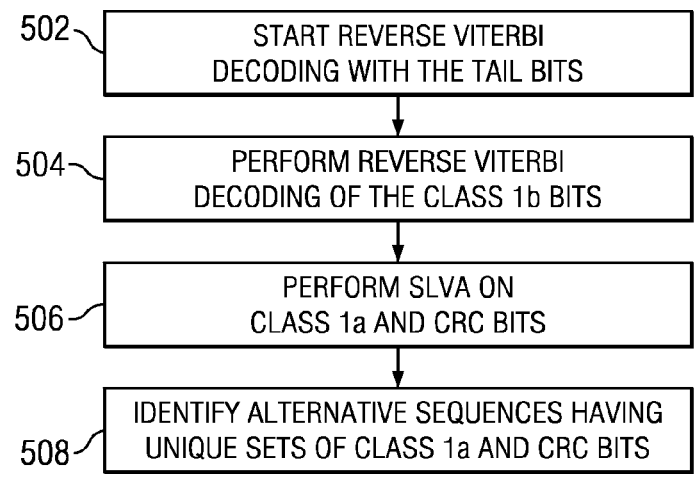
FIG. 5 depicts a flowchart of a method for implementing an embodiment of the present invention.

Accordingly, it is beneficial that the SLVA is designed such that only bit sequences that differ in the class 1a and CRC bits will be found. In a more general statement, the goal is to perform the SLVA such that the only bit sequences are found in which the bits differ in the more important bits which have an additional level of error protection. A reverse or backward Viterbi decoder is used starting with the tail bits that are typically added at the rear of the class 1b bits. Thus, decoding in the reverse direction starts with the tail bits and proceeds to the class 1a bits. The boundary for the SLVA search begins with the class 1a and CRC bits which allows the SLVA to detect alternative sequences starting within the class 1a and CRC bits. Because this produces more alternatives of sequences that may satisfy the CRC, the frame error rate may be reduced. FIG. 5 depicts a flow chart of a method for implementing embodiments of the present invention. In step 502, reverse or backward Viterbi decoding is performed starting with the tail bits. The reverse Viterbi decoding continues, in step 504, with the class 1b bits. These class 1b bits refer to those bits of the convolutionally encoded frame which are considered less important for one reason or another and typically are punctured more heavily and have a lower code rate. Then, in step 506, a serial list Viterbi algorithm can be applied to the class 1a and CRC bits to serially identify each of the most probable sequences of bits, in step 508. The number of alternative sequences identified may be limited to a number on the magnitude of 10 or in the magnitude of 100. Once a probable sequence is identified, the sequence or the frame can be forwarded to a circuit for checking whether it satisfies the CRC. If not, the next most probable sequence can be identified and tested. In the reverse Viterbi decoding, the traceback delta metrics are computed in the opposite direction such that in the trellis diagram, the alternative path proceeds to the right until it joins in with the prior path. By searching only within the class 1a and CRC bits for the smallest delta metrics, it guarantees that each new path differs from any previous path by at least one bit of the class 1a and CRC bits. At the same time, no alternative paths, such as the one in FIG. 3, are overlooked.

Figure 6:
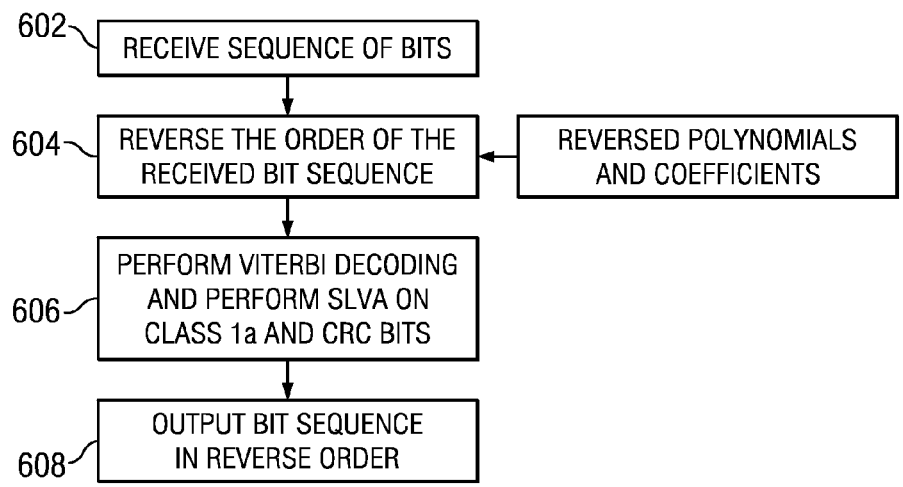
FIG. 6 depicts a flowchart of a method for implementing an embodiment of the present invention.
Figure 7:
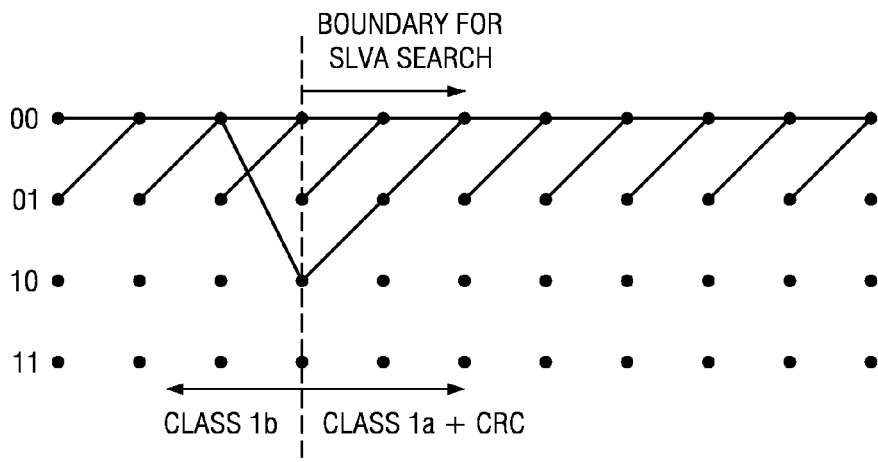
FIG. 7 depicts a trellis diagram related to the method of FIG. 6.

FIG. 6 depicts a flowchart of an alternative method that can implement one or more embodiments of the present invention. In step 602, a frame is received by a receiver having class 1a and CRC bits (or the more important bits) first and then the class 1b bits (or less important bits arriving last. Along with the class 1b bits, tail bits may have been inserted to ensure a predetermined state of the decoder. At the receiving end, in step 604, the order of the sequence of bits is reversed such as, for example, by using a first-in last-out (FILO) buffer. Then, in step 606, standard Viterbi decoding is performed on the reverse bit stream. However, the boundary for the SLVA search is limited to the class 1a and CRC bits which are now in the rear of the frame rather than the beginning. Thus, the best delta metrics are searched for within the class 1a and CRC bits. FIG. 7 depicts this type of trellis diagram. In order for the Viterbi decoding to return the proper results on the reversed bit stream, the order of the polynomials and the coefficients used in decoding must be reversed as well.

As an example of how it works, take the case of a rate ⅓ convolutional code with polynomials P1, P2, and P3. First we use reversed bit order polynomials, so if P1=1+D+D4+D6, then P1rev=1+D2+D5+D6. Secondly we load the polynomials in a reversed order (P3rev,P2rev,P1rev). In Matlab notation, the polynomial standard form for some full and half rate AMR codecs are:

AFS12.2 trl=poly2trellis(5,[23 33],23);
AFS4.75 trl=poly2trellis(7,[133 133 145 175 175],175);
AFS7.95 trl=poly2trellis(5,[23 33],23);
AFS4.75 trl=poly2trellis(7,[133 145 175],133);
The reversed order polynomials are
AFS12.2 trl=poly2trellis(5,[33 31],31);
AFS7.95 trl=poly2trellis(7,[137 137 123 155 155],137);
AFS4.75 trl=poly2trellis(5,[33 31],31);
AHS4.75 trl=poly2trellis(7,[137 123 155],155);

Here for AFS12.2 the polynomial "23" in octal representation can be represented as "10011" in binary, so the reversed order in binary is "11001" or "31" in octal. In the standard order polynomial the "23" was in the first position, but the reversed representation is placed in the last position for the reversed order polynomial.

In step 608, the resulting bit sequence is reversed again so that the class 1a and CRC bits are once again at the front of the frame before the class 1b bits. Verifying the CRC and additional processing can then be performed on the resulting frame.

In the examples above particular bit positions, coding rates, coding schemes, and error protection techniques were identified for purposes of clarity and are not intended to limit the embodiments of the present invention to only these specific examples. Furthermore, embodiments of the present invention are not only applicable to GSM, GPRS, and EDGE but are applicable as well to CDMA, UMB, WCDMA, HSDPA, LTE and many other transmission technologies. While the example described above involved voice data, the same techniques are also applicable to data transmission having different portions with unequal error protection.

Figure 8:
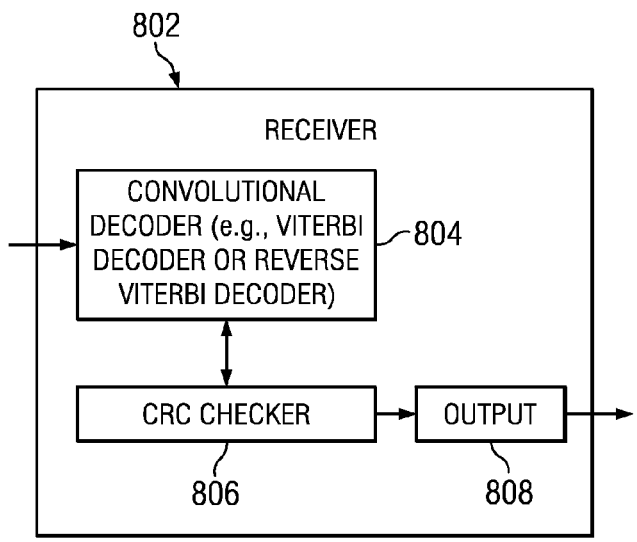
FIG. 8 depicts a system diagram of the functional components of implementing an embodiment of the present invention.

The processes described herein for controlling energy use during resource sharing may be implemented via software, hardware (e.g., general processor, Digital Signal Processing (DSP) chip, an Application Specific Integrated Circuit (ASIC), Field Programmable Gate Arrays (FPGAs), etc.), firmware or a combination thereof. Such exemplary hardware for performing the described functions is detailed below. FIG. 8 depicts the functional components that may be present to implement embodiments of the present invention. In particular a receiver 802 includes a decoding circuitry 804 that receives an input sequence of bits. Before decoding, the input bitstream can pass through signal processing circuitry such as an equalizer or similar circuitry. The decoder decodes the convolutionally encoded bitstream that is received. As discussed above that decoding can involve standard Viterbi decoding or backward Viterbi decoding. The decoding circuitry 804 can also implement a SLVA on a portion of the bit sequence to identify not only the maximum likelihood path but also many other probable paths. The portion of the bit sequence operated on by the SLVA can be limited to bits that also include additional error protection (e.g. CRC). In particular, the probable paths have unique bit sets within the portions operated on by the SLVA. Once a probable path is identified, then the decoded sequence is provided to a CRC checker 806 to determine if the decoded sequence also satisfies the CRC. If not, a next decoded sequence is obtained. If it does pass the CRC, however, then it is provided to output circuitry 808 for further processing.

The previous description is provided to enable any person skilled in the art to practice the various embodiments described herein. Various modifications to these embodiments will be readily apparent to those skilled in the art, and the generic principles defined herein may be applied to other embodiments. Thus, the claims are not intended to be limited to the embodiments shown herein, but are to be accorded the full scope consistent with each claim's language, wherein reference to an element in the singular is not intended to mean "one and only one" unless specifically so stated, but rather "one or more." All structural and functional equivalents to the elements of the various embodiments described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. Also, the term "exemplary" is meant to indicate that some information is being provided as an example only as is not intended to mean that that information is somehow special or preferred. No claim element is to be construed under the provisions of 35 U.S.C. §112, sixth paragraph, unless the element is expressly recited using the phrase "means for" or, in the case of a method claim, the element is recited using the phrase "step for."

What is claimed is:

1. A process of reducing frame error rate in frames of communication data, comprising:
   A. receiving communication data that is protected by convolutional encoding, the data including, in sequence, class 1a bits that are additionally protected by a cyclic redundancy check, cyclic redundancy check bits, and class 1b tail bits that are protected only by the convolutional encoding;
   B. Viterbi decoding the data in a reverse direction starting with the class 1b tail bits and proceeding to the class 1a bits to determine paths in the class 1b tail bits, the cyclic redundancy check bits, and the class 1a bits; and
   C. serial list Viterbi decoding in a forward direction of the data beginning with the class 1a bits and the cyclic redundancy check bits up to a boundary between the cyclic redundancy check bits and the class 1b tail bits to determine a path that may satisfy the cyclic redundancy check bits.

2. The process of claim 1 including forwarding a frame for cyclic redundancy checking once a probable path is identified.

3. The process of claim 1 including forwarding a frame for cyclic redundancy checking once a probable path is identified, and if not, performing another serial list Viterbi decoding beginning with the class 1a bits and the cyclic redundancy check bits to determine whether another path may satisfy the cyclic redundancy check bits.

4. A device for reducing frame error rate in frames of communication data, comprising:
   A. an antennae receiving communication data that is protected by convolutional encoding, the data including, in sequence, class 1a bits that are additionally protected by a cyclic redundancy check, cyclic redundancy check bits, and including class 1b tail bits that are protected only by the convolutional encoding;
   B. a Viterbi decoder coupled to the antennae and decoding the data in a reverse direction starting with the class 1b tail bits and proceeding to the class 1a bits to determine paths in the class 1b tail bits, the cyclic redundancy check bits, and the class 1a bits; and
   C. a serial list Viterbi algorithm decoder coupled to the Viterbi decoder and serial list Viterbi decoding the data beginning with the class 1a bits and the cyclic redundancy check bits up to a boundary between the cyclic redundancy check bits and the class 1b tail bits to determine a path that may satisfy the cyclic redundancy check bits.

5. The device of claim 4 including a cyclic redundancy check unit for cyclic redundancy checking a frame once a probable path is identified.

6. The device of claim 4 including a cyclic redundancy check unit for cyclic redundancy checking once a probable path is identified, and if not, the serial list Viterbi algorithm decoder performing another serial list Viterbi decoding beginning with the class 1a bits and the cyclic redundancy check bits to determine whether another path may satisfy the cyclic redundancy check bits.

* * * * *